United States Patent
Dyer et al.

(10) Patent No.: US 7,504,299 B2
(45) Date of Patent: Mar. 17, 2009

(54) FOLDED NODE TRENCH CAPACITOR

(75) Inventors: Thomas W. Dyer, Pleasant Valley, NY (US); Carl Radens, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 10/597,432

(22) PCT Filed: Jan. 30, 2004

(86) PCT No.: PCT/US2004/002648

§ 371 (c)(1),
(2), (4) Date: Jul. 25, 2006

(87) PCT Pub. No.: WO2005/083781

PCT Pub. Date: Sep. 9, 2005

(65) Prior Publication Data

US 2008/0246069 A1   Oct. 9, 2008

(51) Int. Cl.
*H01L 21/8242* (2006.01)
*H01L 21/20* (2006.01)

(52) U.S. Cl. .................. 438/244; 438/246; 438/387; 438/389; 257/E21.651

(58) Field of Classification Search .............. 438/244, 438/246, 387, 389
See application file for complete search history.

(56) References Cited

U.S. PATENT DOCUMENTS

| | | |
|---|---|---|
| 4,877,750 A | 10/1989 | Okumura |
| 5,776,628 A | 7/1998 | Kraft et al. |
| 6,020,234 A | 2/2000 | Li et al. |
| 6,057,188 A | 5/2000 | El-Kareh et al. |
| 6,150,210 A | 11/2000 | Arnold |
| 6,190,988 B1 | 2/2001 | Furukawa et al. |
| 6,204,112 B1 | 3/2001 | Chakravarti et al. |
| 6,319,788 B1 | 11/2001 | Gruening et al. |
| 6,326,261 B1 | 12/2001 | Tsang et al. |
| 2001/0044180 A1 | 11/2001 | Schrems |
| 2003/0022457 A1 | 1/2003 | Gutsche et al. |
| 2004/0023465 A1* | 2/2004 | Gonzalez .................. 438/396 |
| 2004/0046195 A1* | 3/2004 | Nakamura et al. .......... 257/296 |
| 2004/0108533 A1* | 6/2004 | Chen et al. .................. 257/296 |

FOREIGN PATENT DOCUMENTS

| | | |
|---|---|---|
| EP | 0546976 | 6/1993 |
| JP | 64-72551 | 3/1989 |
| JP | 11-204758 | 7/1999 |
| JP | 11-214651 | 8/1999 |
| JP | 2000-91525 | 3/2000 |

\* cited by examiner

*Primary Examiner*—Alexander G Ghyka
(74) *Attorney, Agent, or Firm*—Joseph P. Abate

(57) ABSTRACT

A trench capacitor is filled with a set of two or more storage plates by consecutively depositing layers of dielectric and conductor and making contact to the ground plates by etching an aperture through the plates to the buried plate in the substrate and connecting the one or more ground plate to the substrate; the charge storage plates are connected at the top of the capacitor by blocking the end of the first plate during the formation of the second ground plate and exposing the material of the first storage plate during deposition of the second storage plate.

14 Claims, 5 Drawing Sheets

FOLDED NODE TRENCH CAPACITOR

TECHNICAL FIELD

The field of the invention is that of forming integrated circuit trench capacitors, in particular capacitors for use in DRAM cells.

BACKGROUND OF THE INVENTION

Semiconductor memory devices, and particularly Dynamic Random Access Memory (DRAM) devices are well known. An essential feature of a DRAM is a memory cell. A cell comprises a capacitor for storing charge and an access transistor (also referred to as a pass transistor or a pass gate) for transferring charge to and from the capacitor. Trench, or deep trench (DT), capacitors are typical and are well known. A cell also comprises a means (often referred to as a strap) for connecting one transistor source/drain region to the capacitor. At the present state of the art, more than 256 million DRAM cells are present on a memory chip, organized in the form of an array. Thus, because cell size determines chip density, size and cost, reducing cell area is the DRAM designer's primary goal. Cell area may be reduced by shrinking the individual feature size, or by forming structures which make more efficient use of the chip surface area. The latter approach is particularly desirable.

In a typical process for fabricating DRAM devices having trench capacitors, the capacitor structure is completely formed prior to the formation of the transistor gate conductor (GC) structure. Thus, a typical process sequence involves the steps of opening the trench, filling the trench, forming the node conductors, then forming the gate stack structure.

As is known in the art, integrated circuits (ICs) or chips employ capacitors for charge storage purposes. An example of an IC that employs capacitors for storing charge is a memory IC, such as a dynamic random access memory (DRAM) chip. The level of the charge ("0" or "1") in the capacitor represents a bit of data.

A DRAM chip includes an array of memory cells interconnected by rows and columns. Typically, the row and column connections are referred to as wordlines and bitlines, respectively. Reading data from or writing data to the memory cells is accomplished by activating the appropriate wordlines and bitlines.

Typically, a DRAM memory cell comprises a transistor connected to a capacitor. The transistor includes two diffusion regions separated by a channel, opposite which is located a gate. Depending on the direction of current flow between the diffusion region, one is referred to as the drain and the other the source. The terms "drain" and "source" are herein used interchangeably to refer to the diffusion regions. The gate is coupled to a wordline and one of the diffusion regions is coupled to a bitline. The other diffusion region is coupled to the capacitor. Applying an appropriate voltage to the gate switches the transistor on, enabling current to flow through channel between the diffusion regions to form a connection between the capacitor and bitline. Switching off the transistor severs this connection by preventing current flowing through the channel.

The charge stored in the capacitor dissipates over time due to current leakage therefrom. Before the charge dissipates to an indeterminate level (below a threshold), the node has to be refreshed.

Continued demand to shrink devices has facilitated the design of DRAMs having greater density and smaller feature size and cell area. To produce cells that occupy less surface area, smaller components such as capacitors are used. However, the use of smaller capacitors results in decreased storage capacity, which can adversely affect the performance and operability of the memory device. For example, sense amplifiers require an adequate signal level to reliably sense the information in the cells. The ratio of storage capacitance to bitline capacitance is crucial in determining the signal level. If the capacitor becomes too small, this ratio may be too small to provide an adequate signal. Also, smaller storage capacity requires higher refresh frequency.

One type of capacitor that is commonly employed in DRAMs is a trench capacitor. A trench capacitor is a three-dimensional structure formed in the silicon substrate. Increasing the volume or capacitance of the trench capacitor can be achieved by etching deeper into the substrate. As such, increasing the capacitance of the trench capacitor does not increase the surface area of the cell.

A conventional trench capacitor comprises a trench etched into the substrate. The trench is typically filled with n+ doped poly which serves as an electrode of the capacitor (referred to as the storage node). Optionally, a second electrode of the capacitor, referred to as a "buried plate," is formed by out-diffusing n+ dopants from a dopant source into a region of the substrate surrounding the lower portion of the trench. A n+ doped silicate glass such as Arsenic doped silicate glass (ASG) serves as the dopant source. A node dielectric comprising nitride is provided to separate the two electrodes of the capacitor.

In the upper portion of the trench, a dielectric collar is provided to prevent leakage from the node junction to the buried plate. The node dielectric in the upper portion of the trench where the collar is to be formed is removed prior to its formation. Removal of the nitride prevents vertical leakage along the collar.

There is constant pressure to reduce the dimensions of DRAM cells and constant pressure to save cost by reducing the depth of the trench.

Planar capacitors use two or more capacitor storage plates in the same silicon area.

Trench capacitor technology has not been able to place two or more storage palates in a trench.

SUMMARY OF THE INVENTION

The invention relates to a trench capacitor having two or more plates within the trench to increase the surface area of the capacitor.

A feature of the invention is successive deposition of a first variable capacitor plate, a ground plate and a second variable capacitor plate.

Another feature of the invention is etching through the bottom of a stack of plates to make contact with the substrate and closing off edges of conductive layers by forming dielectric on the exposed edges.

DETAILED DESCRIPTION

The inventive process begins with conventional steps of etching a deep trench that will hold the capacitor. Illustratively, the deep trench etch is performed with a TEL SCCM etch tool and NF3/HBr chemistry.

In current practice, the trenches used for DRAM cells are etched to a depth of about eight microns. It is an advantageous feature of the invention that the increased capacitance provided by the inventive process can be used to provide a trench that is less deep and therefore reduce the cost of the integrated circuit.

Figure 1:
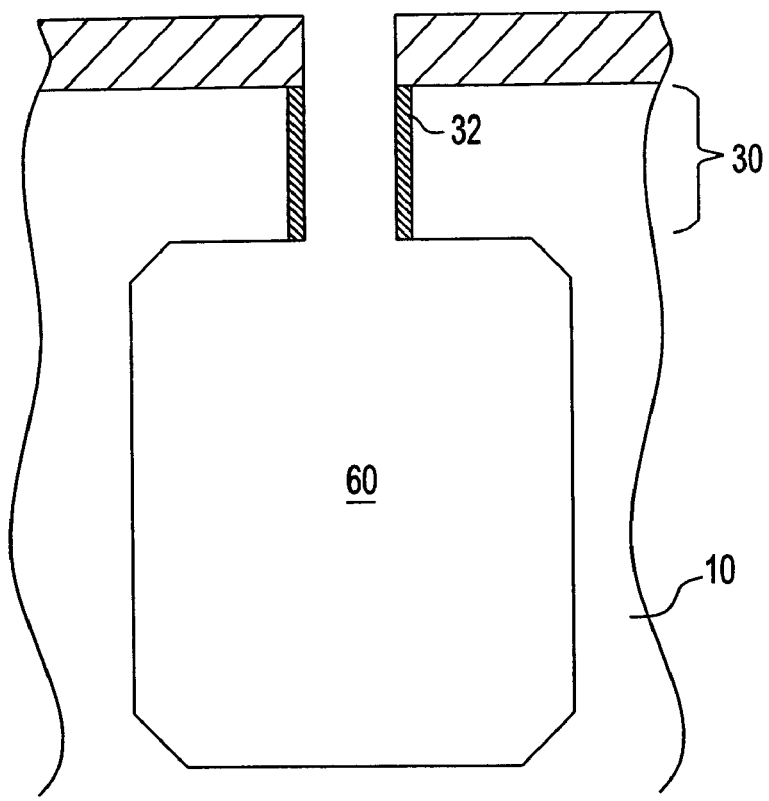
FIG. 1 shows a silicon substrate containing a deep trench after the "bottle etch" step.

FIG. 1 shows the structure after steps of depositing a protective liner on the trench walls, stripping the liner in the lower portion and etching the bulk silicon substrate laterally in a wet etch or isotropic dry etch.

Those skilled in the art will appreciate that the direction of etching may be controlled over a wide range—from the highly directional process used to etch the initial trench to an isotropic process having a substantial lateral etching action.

In this example, the initial trench width of nominally 100 nm is expanded to a nominal 250 nm by the bottle etch, producing aperture 60 in a capacitor area denoted generally by numeral 50. Particular examples of the invention will have variable dimensions depending on the cell layout and the ground rules for the particular process being used.

Illustratively, the protective liner 32 is formed of 2 nm oxide, 4 nm nitride, 10 nm poly and 6 nm of nitride. Other combinations of materials and thicknesses may be used for particular needs.

At the top of the Figure, pad nitride 20 protects the surface of substrate 10 and bracket 30 indicates a recess depth that defines the depth of the capacitor portion and also defines the upper portion where the vertical transistor of the DRAM cell will be formed.

The process followed is that, after liner 32 is formed, resist is formed in the trench and recessed to a nominal depth of 1.5 microns, referred to as the capacitor top position. The outer nitride layer of liner 32 is stripped, exposing the poly layer beneath. The remaining resist in the lower portion of the trench is stripped, to avoid exposing it to the high temperature of the oxidation step. The poly in the upper portion is then is oxidized, so that liner 32 has an outer layer of oxide in the upper portion and an outer layer of nitride in the lower portion.

Layer 32 is then stripped in the lower portion. The outer nitride is stripped while the oxide in the upper portion protects the walls there. Similarly, the oxide in the upper portion protects it while the poly and the second nitride layer in the lower portion are removed. When the last layer (oxide) in the lower portion is removed, the oxide in the upper portion will be attacked. If the oxide in the upper portion is thick enough, it will remain. If not, the poly or the nitride below it will protect the surface of silicon 10. The result is shown in FIG. 1.

Optionally, a layer of hemispherical grained silicon (HSG) may be put down in a conventional process to improve the surface area.

Figure 2:
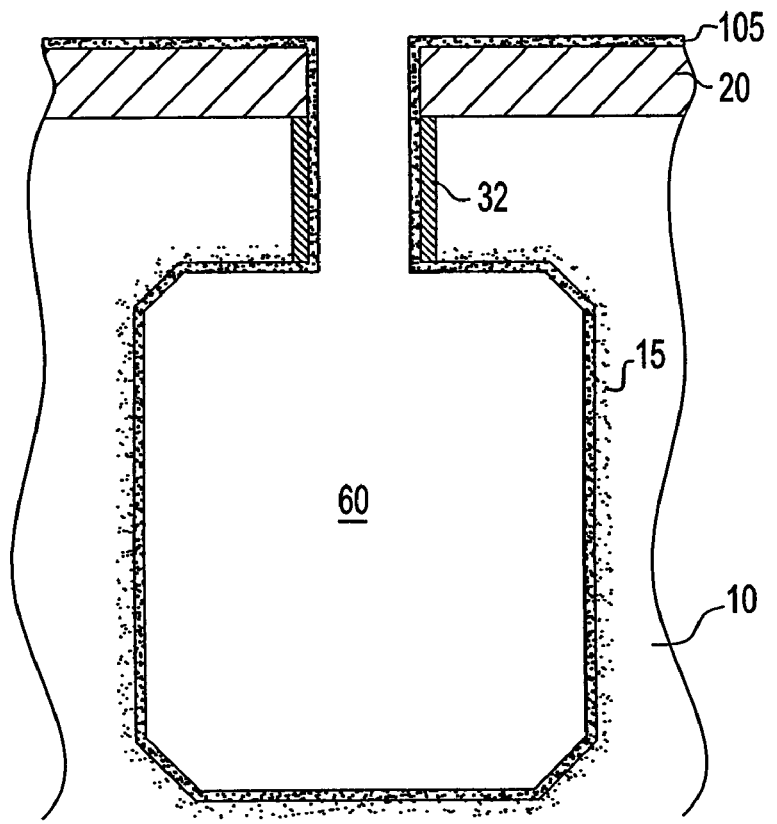
FIG. 2 shows the same area after forming the buried plate by gas phase doping.
Figure 3:
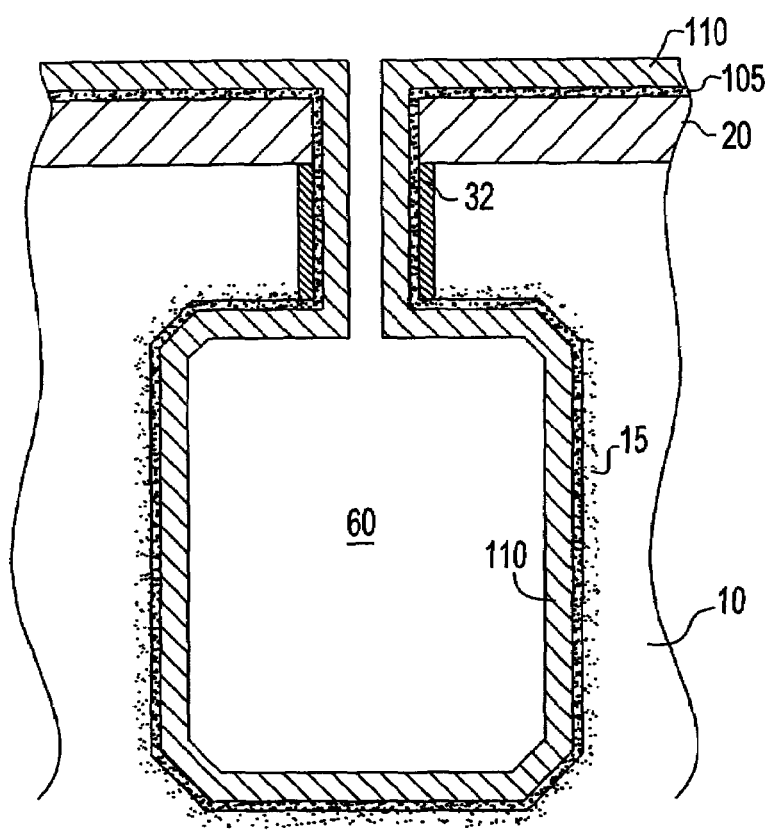
FIG. 3 shows the area after depositing the first conductive layer.

FIG. 2 shows the result of gas phase doping with arsenic in the lower portion to form buried plate 15 that will be the ground plate (capacitor plate) of the capacitor and the deposition of a conformal nitride liner 105, illustratively 4 nm thick, that extends throughout the lower portion and also over the upper portion of the trench and the top of pad nitride 20. Dielectric 105 may optionally be subjected to a "re-ox" procedure in which the node nitride is exposed to an oxidizing ambient. This process improves the electrical properties of the nitride, i.e. it reduces the leakage current through the node nitride when a voltage is applied.

FIG. 2 shows the result of depositing a conformal layer of doped poly 110 that will form the first storage plate of the capacitor, illustratively 30 nm thick, that also covers the lower portion and also the narrower upper portion and the top of the substrate. This shows the basic structure of the capacitor process—a layer of dielectric followed by a layer of conductor. The challenge in making a multi-plate capacitor is to connect the various ground plates and storage plates reliably.

Figure 4:
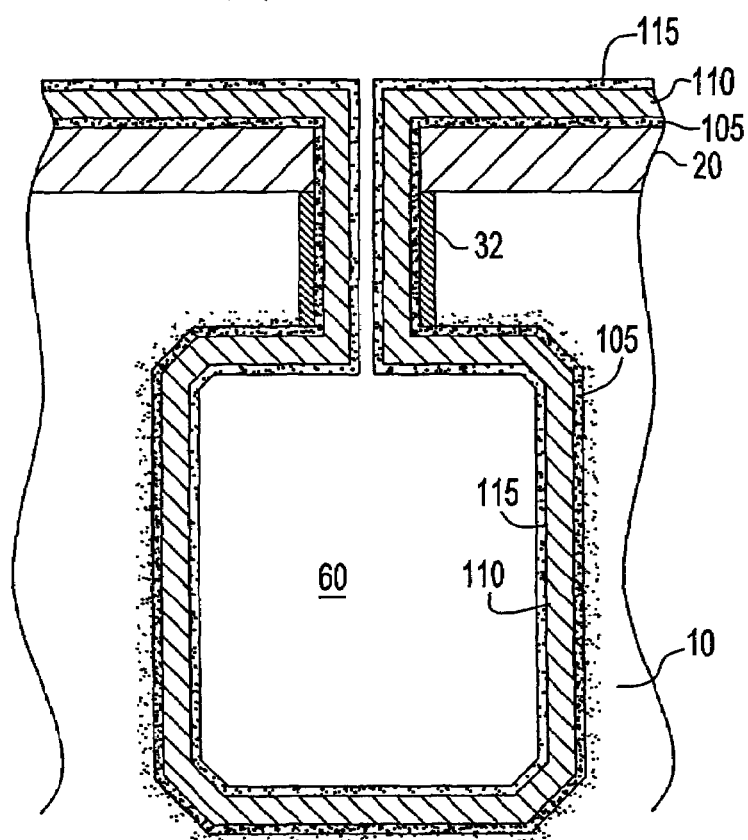
FIG. 4 shows the area after depositing the second dielectric layer.

FIG. 4 shows the result of depositing a second nitride layer 115, having the same thickness as layer 105. FIG. 4 shows a narrow gap in the upper portion between the poly layers on the two sides. This gap would plug up the narrow portion and prevent deposition of further layers if it is not cleared.

Figure 5:
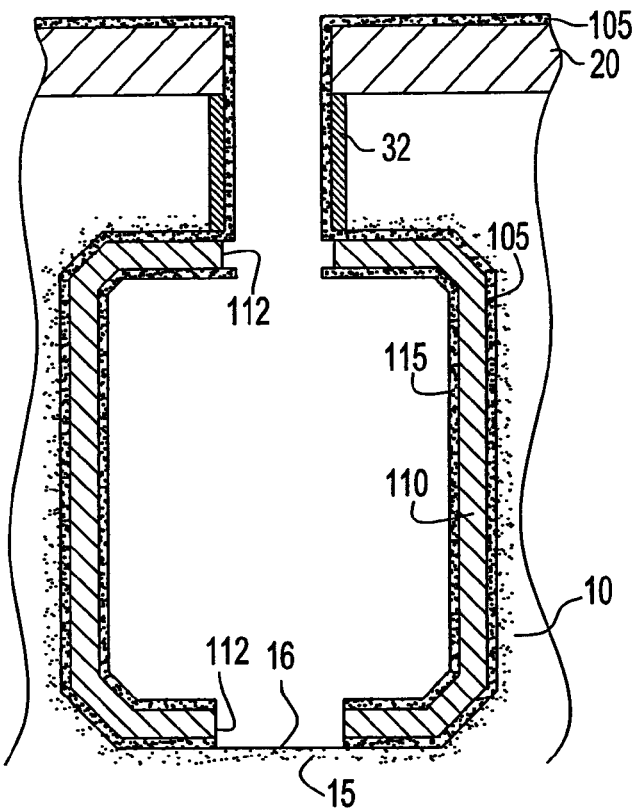
FIG. 5 shows the area after etching through the previous layers to make contact with the buried plate.

FIG. 5 shows the result of etching layers 115 and 110 with a directional dry etch. At the bottom of the Figure, a bottom aperture with a surface 16 indicates the exposed surface of the bulk silicon that has been doped to form buried plate 15. This area will provide the electrical contact between the buried plate and the interior ground plate of the multi-plate capacitor. Surfaces 112 are the exposed ends of layer 110. These surfaces must be isolated from the ground plate that will be put down in order to avoid shorting the capacitor plates.

Figure 6:
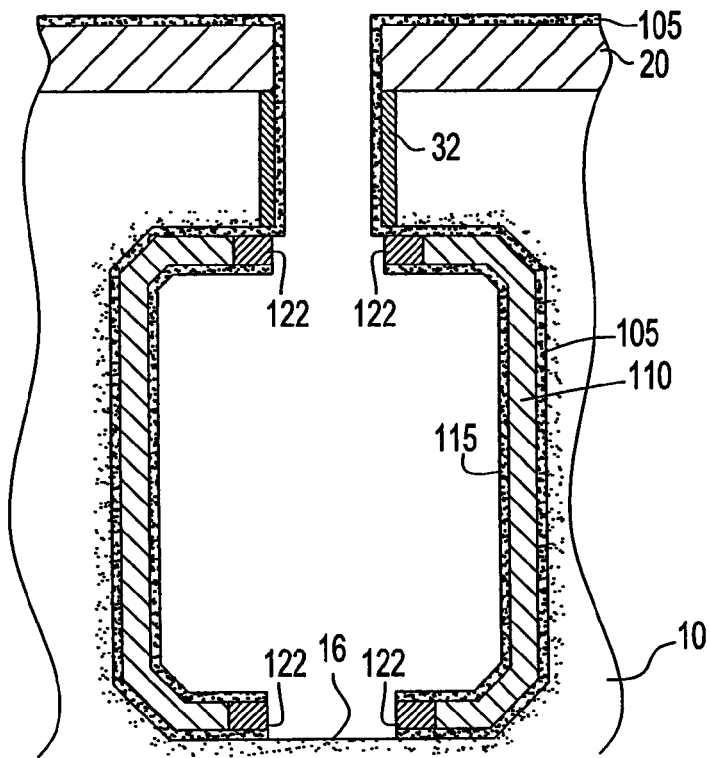
FIG. 6 shows the area after closing off exposed conductors.

FIG. 6 shows the result of a thermal oxidation step that forms an oxide plug 122, nominally 30 nm thick, on upper and lower exposed surfaces 112 of poly 110. There will be some oxide grown on surface 16 that can be removed by a short wet etch or directional dry etch to maintain a good contact on surface 16.

Figure 7:
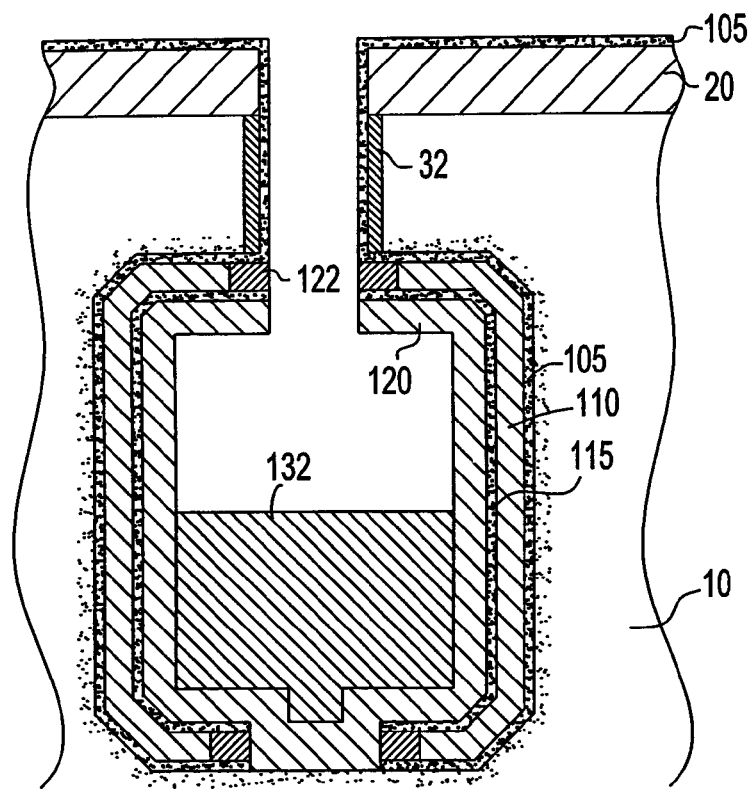
FIG. 7 shows the area after clearing the upper portion of the trench after the deposition of the second conductive layer.

A second ground (capacitor) plate 120 is formed by depositing a conformal layer of doped poly with the same parameters as used for layer 110. At the bottom of the Figure, electrical contact has been made between ground plate 120 and buried plate 15. Aperture 60 is filled again with resist 132 that is non-critically recessed past the narrow portion of the trench. Another poly cleanup is performed to remove the poly 120 from the upper portion of the trench, as far down as the top of layer 120. The result is shown in FIG. 7. Resist 132 is then stripped, exposing the surface of poly 120.

Figure 8:
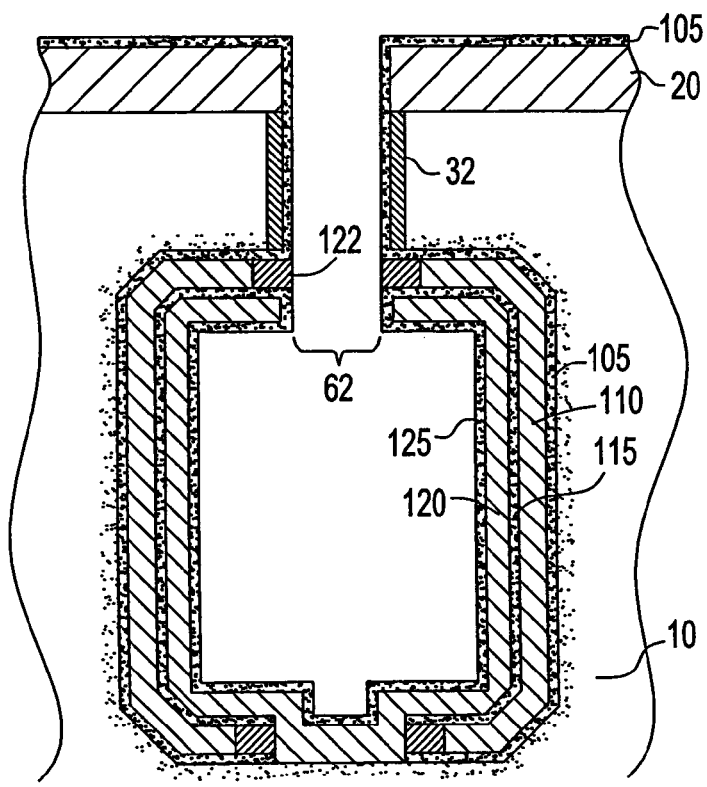
FIG. 8 shows the area after forming the third dielectric layer.

FIG. 8 shows the result of nitriding the surface of poly 120 to produce nitride layer 125, illustratively the same thickness as layers 105 and 115. This is a thermal nitride process, not a conformal deposition, so that nitride does not form on the surface of oxide plugs 122 or on layer 105 in the narrow portion of the trench.

Bracket 62 indicates the width of the upper trench. It can be seen that the upper contact position of plate 110 is outside the area of the upper trench and there is no straight line reaching from the surface of substrate 10 to the contact edge of plate 110.

Figure 9:
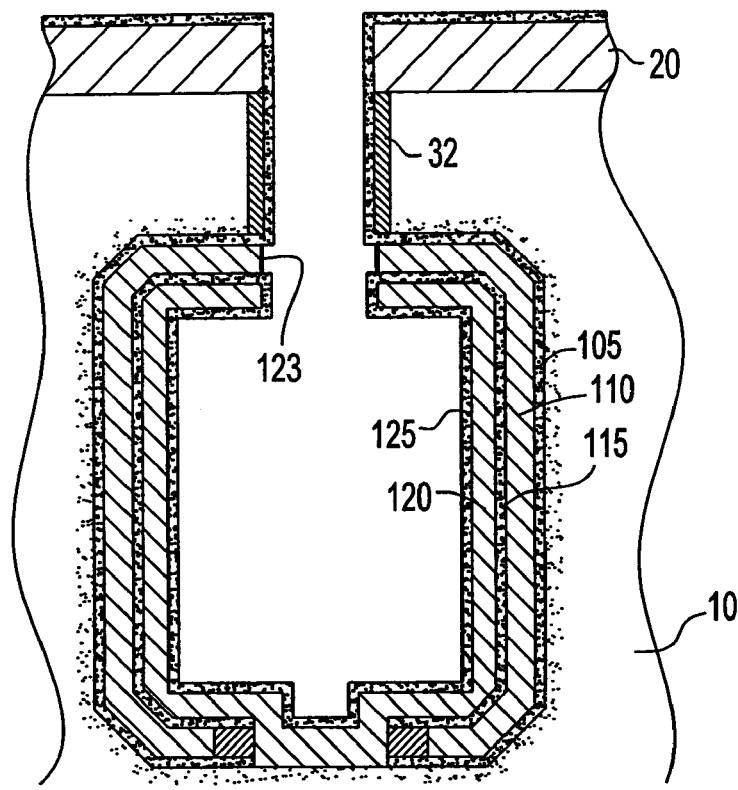
FIG. 9 shows the area after exposing the edge of the first capacitor plate in preparation for the second capacitor plate.

FIG. 9 shows the result of a wet etch that removes oxide plugs 122 at the upper portion of the capacitor without attacking nitride 125 or nitride 105 in the upper portion. A clean surface 123 on poly 110 is now available to make contact with the second poly storage plate.

Figure 10:
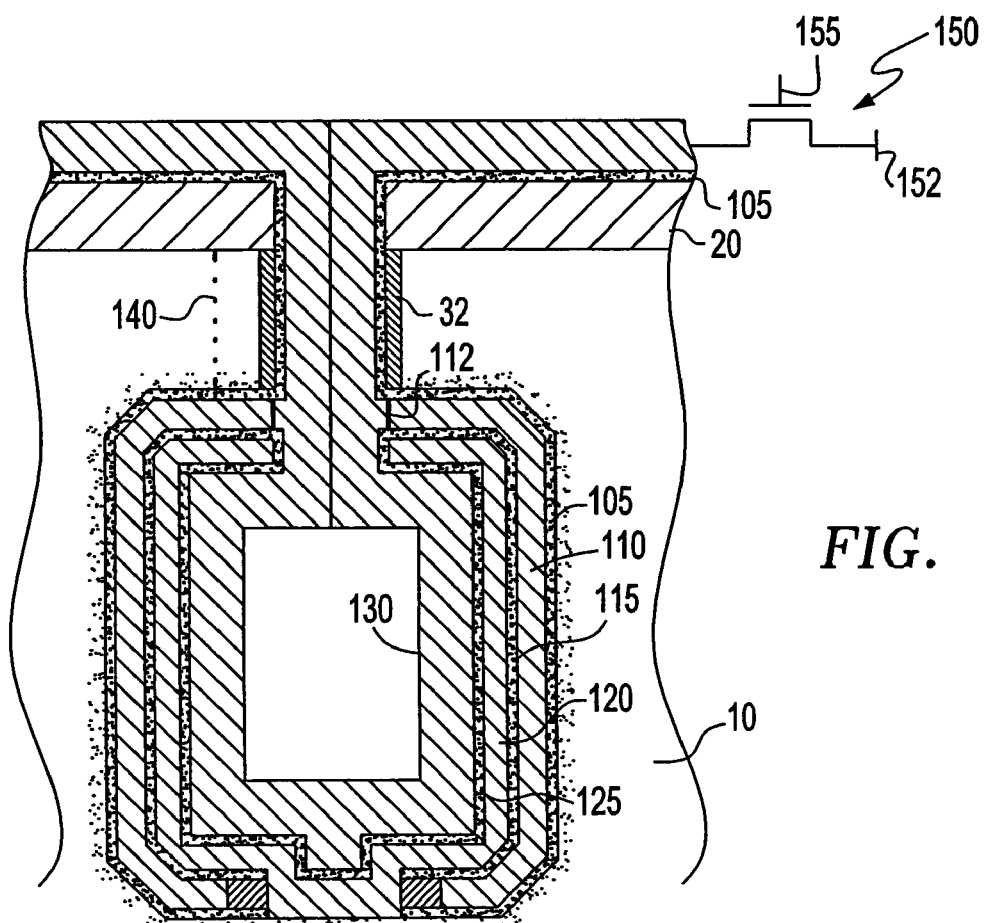
FIG. 10 shows the structure after the deposition of the second capacitor plate.

FIG. 10 shows the result of the conformal deposition of poly 130, which forms the second storage plate of the capacitor. The capacitor structure is buried ground plate 15, first dielectric 105, first storage plate 110, second dielectric 115, second ground plate 120, third dielectric 125 and second storage plate 130.

At the top of the Figure, dotted line 140 denotes schematically the location of a vertical transistor that completes the DRAM cell. The fabrication of the vertical transistor is well known in the art.

At the upper right of the Figure, a transistor symbol 150, with bitline 152 and wordline 150 denotes the electrical completion of the DRAM cell and its connection to the lines of a memory array.

A trench capacitor according to the invention may be used with vertical or planar transistors in a DRAM, whether an embedded DRAM array or a single-purpose DRAM circuit. A capacitor according to the invention may be used in any circuit and is not confined to a DRAM application.

Different materials may be used than those illustrated to perform the same functions.

The steps of the process may be continued to place another dielectric/groundplate/dielectric/storage plate combination within the trench.

An example of a process sequence according to the invention may be summarized as follows:
1 Form a deep trench
2 deposit a liner on the interior surface of the trench
   2 nm oxide, 4 nm nitride, 10 nm poly, 6 nm nitride
3 Fill the trench with resist, recess the resist to 1.5 um, strip the outer nitride layer
4 resist strip
5 oxidize the exposed poly in the upper portion.
6 strip the liner layers in the bottom, exposing the crystal silicon walls
7 trench bottle etch
8 optional HSG and HSG recess
9 gas phase doping for buried plate
10 first node nitride (re-ox)
11 first storage plate poly (optional HSG)
12 second node nitride (re-ox)
13 poly/nitride RIE to expose edge of first plate/buried plate
14 poly thermal oxide/expose buried plate
15 poly dep—second ground plate
16 resist/resist recess
17 poly RIE to clear upper portion
18 selective poly nitridation/re-ox
19 oxide wet etch—expose top edge of first storage plate
20 poly dep—second storage plate
21 collar formation, transistor formation, back end

INDUSTRIAL APPLICABILITY

The invention applies to a method of forming a capacitor embedded in a substrate, such as an integrated circuit substrate, that may be used in an electrical circuit, such as a dynamic random access memory, and the structure of the capacitor formed by the method Capacitors formed according to the invention may be used in computers and other electronic devices and systems.

While the invention has been described in terms of a single preferred embodiment, those skilled in the art will recognize that the invention can be practiced in various versions within the spirit and scope of the following claims.

What is claimed is:

1. A method of forming a capacitor in a substrate comprising the steps of:
   etching a trench in said substrate;
   forming a first capacitor plate by diffusing a dopant into said substrate;
   depositing a first conformal dielectric layer on an interior surface of said trench;
   depositing a first conductive storage plate on an interior surface of said first dielectric layer;
   depositing a second conformal dielectric layer on an interior surface of said first conductive storage plate;
   etching directionally through said second dielectric layer and said first storage plate to expose a substrate contact surface of said first capacitor plate whereby upper and lower edges of said first storage plate are exposed;
   forming an insulator covering said exposed upper and lower edges of said first storage plate;
   depositing a second capacitor plate on an interior surface of said second dielectric layer, to make electrical contact with said substrate contact surface;
   forming a third dielectric layer on exposed interior surfaces of said second capacitor plate;
   removing said insulator covering said exposed upper edge of said first storage layer, thereby exposing said upper edge of said first storage plate; and
   depositing a second conductive storage plate abutting said third dielectric layer, thereby establishing electrical contact between said first and second conductive storage plates, which are separated from said first and second capacitor plates by said first, second and third dielectric layers.

2. A method according to claim 1, further comprising a step, before said step of forming a first capacitor plate of, forming a dopant protective layer having an outer nitride layer on the interior surface of said trench;
   depositing resist, recessing said resist to a capacitor top position below a substrate surface;
   stripping said outer nitride layer above said capacitor top position;
   stripping said dopant protective layer below said capacitor top position, thereby exposing said substrate.

3. A method according to claim 2, in which said substrate is a silicon wafer;
   said dopant protective layer comprises a layer of oxide adjacent to said substrate, a layer of nitride, a layer of poly and an outer layer of nitride; and, after said step of stripping said outer layer, further comprising a step of oxidizing said layer of poly.

4. A method according to claim 1, further comprising a step of performing a bottle etch before said step of diffusing dopant into said substrate, thereby forming an upper portion of said trench having a first width and a lower portion of said trench having a second width greater than said first width.

5. A method according to claim 1, further comprising a step of forming a layer of hemispherical grained silicon on an interior surface of at least one silicon layer.

6. A method according to claim 1, in which said step of forming a third dielectric layer is performed by thermal nitridation.

7. A method according to claim 4, further comprising, after said step of forming said first storage plate, a step of removing material from said first storage plate from said upper portion of said trench, thereby forming a contact edge of said first storage plate.

8. A method according to claim 7, in which said second storage plate makes contact with said first storage plate at said contact edge, disposed outside said first width of said upper portion of said trench.

9. A method according to claim 1, further comprising a step of forming a transistor having one electrode connected to said storage plate of said capacitor and a second electrode connected to a cell electrode, thereby forming a DRAM cell.

10. A method according to claim 9, further comprising a step, before said step of forming a first capacitor plate of, forming a dopant protective layer having an outer nitride layer on the interior surface of said trench;
depositing resist, recessing said resist to a capacitor top position below a substrate surface;
stripping said outer nitride layer above said capacitor top position;
stripping said dopant protective layer below said capacitor top position, thereby exposing said substrate.

11. A method according to claim 10, in which said substrate is a silicon wafer; said dopant protective layer comprises a layer of oxide adjacent to said substrate, a layer of nitride, a layer of poly and an outer layer of nitride; and, after said step of stripping said outer layer, further comprising a step of oxidizing said layer of poly.

12. A method according to claim 10, further comprising a step of performing a bottle etch before said step of diffusing dopant into said substrate, thereby forming an upper portion of said trench having a first width and a lower portion of said trench having a second width greater than said first width.

13. A method according to claim 12, further comprising, after said step of forming said first storage plate, a step of removing material from said first storage plate from said upper portion of said trench, thereby forming a contact edge of said first storage plate.

14. A method according to claim 13, in which said second storage plate makes contact with said first storage plate at said contact edge, disposed outside said first width of said upper portion of said trench.

* * * * *